(12) United States Patent
Trefonas, III et al.

(10) Patent No.: US 7,202,009 B2
(45) Date of Patent: Apr. 10, 2007

(54) POLYMERS AND PHOTORESIST COMPOSITIONS FOR SHORT WAVELENGTH IMAGING

(75) Inventors: Peter Trefonas, III, Medway, MA (US); Gary N. Taylor, Northboro, MA (US); Charles R. Szmanda, Westborough, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/948,526

(22) Filed: Sep. 8, 2001

(65) Prior Publication Data

US 2002/0051938 A1 May 2, 2002

Related U.S. Application Data

(60) Provisional application No. 60/231,048, filed on Sep. 8, 2000.

(51) Int. Cl.
G03F 7/038 (2006.01)
G03F 7/039 (2006.01)
G03F 7/033 (2006.01)
G03F 7/032 (2006.01)
G03F 7/30 (2006.01)

(52) U.S. Cl. .................. 430/270.1; 430/325; 430/326; 430/905; 430/907; 430/910

(58) Field of Classification Search .............. 430/270.1, 430/905, 907, 910, 325, 326
See application file for complete search history.

(56) References Cited

U.S. PATENT DOCUMENTS

| 5,399,460 | A  | * | 3/1995  | Aldrich et al. ........... 430/287.1 |
| 6,200,731 | B1 |   | 3/2001  | Lee et al. |
| 6,306,554 | B1 |   | 10/2001 | Barclay et al. |
| 6,432,608 | B1 | * | 8/2002  | Fujie et al. .............. 430/270.1 |
| 6,451,499 | B1 | * | 9/2002  | Jayaraman et al. ....... 430/270.1 |

OTHER PUBLICATIONS

S. Kishimura et al., "Approach for VUV Positive Resist Using Photodecomposable Polymers", Proceedings of the SPIE—The International Society for Optical Engineering, vol. 3999, No. 1, Mar. 1, 2000, pp. 347-356, XP002192926, USA, p. 352; figure 1.
S.-J. Choi et al.: "Design and Synthesis of New Photoresist Materials for ArF Lithography" Proceedings of the SPIE—The International Society for Optical Engineering, vol. 3999, No. 1, Mar. 1, 2000, pp. 54-61, XP002193478, USA, p. 56.
H.-W. Kim et al., "Novel Polymers for 193 nm Single Layer Resist Based on Cycloolefin Polymers", Proceedings of the SPIE—The International Society for Optical Engineering, vol. 3999, No. 2, Mar. 1, 2000; pp. 1100-1107, XP002193479, USA, p. 1101; Figure 2.
J.-B. Kim et al., "Chemically Amplified Resists Based on the Norbornene Copolymers with Steroid Derivatives", Proceedings of the SPIE—The International Society for Optical Engineering, vol. 3678, No. 1, Mar. 17, 1999, pp. 36-43, XP002179488 USA, p. 38, Figure 2.
T. Aoai et al., "Structural Design of New Alicyclic Acrylate Polymer with Androstane Moiety for 193 nm Resist", Proceedings of the SPIE—The International Society for Optical Engineering, vol. 3678, No. 1, Mar. 17, 1999, pp. 283-293, XP000997830, USA p. 292; Figure 7.

* cited by examiner

Primary Examiner—Richard L. Schilling
(74) Attorney, Agent, or Firm—Peter F. Corless; Darryl P. Frickey; Edwards Angell Palmer Dodge LLP

(57) ABSTRACT

This invention relates to resins and photoresist compositions that comprise such resins. Preferred polymers of the invention comprise adjacent saturated carbon atoms, either integral or pendant to the polymer backbone, that have a substantially gauche conformation. Polymers of the invention are particularly useful as a resin binder component of chemically-amplified positive-acting resists that can be effectively imaged at short wavelengths such as sub-200 nm and preferably about 157 nm. In such short-wavelength imaging applications, polymers of the invention that have a population of dihedral angles of adjacent saturated carbon atoms that are enriched in substantially gauche conformations can provide reduced undesired absorbance of the high energy exposure radiation.

37 Claims, No Drawings

POLYMERS AND PHOTORESIST COMPOSITIONS FOR SHORT WAVELENGTH IMAGING

This application claims the benefit of U.S. Provisional Application No. 60/231,048 filing date Sep. 8, 2000.

BACKGROUND OF THE INVENTION

1. Field of the Invention

The present invention includes new polymers that comprise adjacent saturated carbon atoms, either integral or pendant to the polymer backbone, that have a substantially gauche conformation. Polymers of the invention are particularly useful as a resin binder component of chemically-amplified positive-acting resists that can be effectively imaged at short wavelengths such as sub-200 nm and preferably about 157 nm. In such short-wavelength imaging applications, polymers of the invention that have a population of dihedral angles of adjacent saturated carbon atoms that are enriched in substantially gauche conformations can provide reduced undesired absorbance of the high energy exposure radiation.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, such as wavelengths of about 193 nm. Use of such short exposure wavelengths can enable formation of smaller features. Accordingly, a photoresist that yields well-resolved images upon 248 nm or 193 nm exposure could enable formation of extremely small (e.g. sub-0.25 m) features that respond to constant industry demands for smaller dimension circuit patterns, e.g. to provide greater circuit density and enhanced device performance.

Recently, use of an $F_2$ excimer laser imaging source which provides radiation having a wavelength of about 157 nm, has been considered as a route to manufacture of even smaller features. See, generally, Kunz et al., SPIE Proceedings (Advances in Resist Technology), vol. 3678, pages 13–23 (1999).

SUMMARY OF THE INVENTION

We have now found novel polymers and photoresist compositions that comprise the polymers as a resin binder component. The photoresist compositions of the invention can provide highly resolved relief images upon exposure to extremely short wavelengths, particularly sub-200 nm wavelengths, and even sub-170 nm or sub-160 nm wavelengths, such as 157 nm.

More particularly, polymers of the invention have adjacent carbons that can a dihedral angle of less or greater than 180°, preferably a dihedral angle of less than about 170°, about 160° or about 150°, or less than about 140°, more preferably less than about 130°, about 120°, about 110°, about 100°, about 90°, about 80° or about 70°. A dihedral angle of about 60° (i.e. gauche conformation) is particularly preferred. The term "dihedral angle" as used herein means the same as the term "torsion angle", both of which terms are discussed in Carey and Sundberg, Advanced Organic Chemistry, Part A: page 100 et seq. ($2^{nd}$ ed. Plenum Press).

Corresponding dihedral angles that are greater than 180° also are preferred, i.e. preferred are dihedral angles of adjacent carbon atoms or greater than about 190°, more preferably greater than about 200°, about 210°, about 220°, about 230°, about 240°, about 250°, about 260°, about 270°, about 280°, about 290° or about 300°. A dihedral angle of about 300° is particularly preferred. To further illustrate, set forth immediately below are schematic depictions of the undesired (i.e. 180°, trans or anti) and preferred (i.e. less than or greater than 180°) conformations including gauche conformations of 60° and 300° and other suitable conformations of other than 180°.

Trans or Anti Conformation

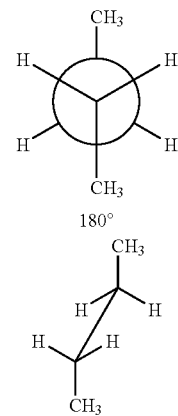

Gauche and Other Preferred Conformations
}

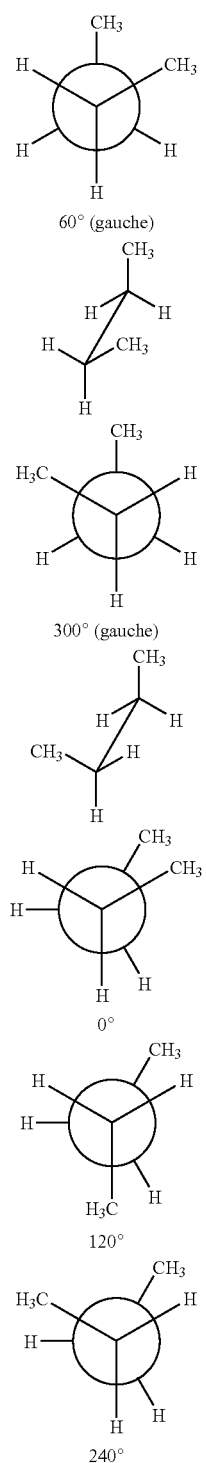

By reducing the content of trans conformations of a polymer, the polymer can exhibit reduced absorption of short wavelength radiation, particularly sub-160 nm radiation such as 157 nm radiation. Without being bound by theory, with saturated carbons positioned in trans conformations, such high energy radiation can be absorbed via the sigma→sigma* absorption band. That absorption band is less accessible where adjacent carbons are positioned in other than trans conformation (i.e. 180° dihedral angle), and the absorption band is particularly remote where adjacent carbons are in substantially gauche conformations, i.e. dihedral angles of about 60° or 300°.

Such offset configurations can be provided by a number of approaches. For instance, to offset carbons of a polymer backbone, a variety of groups may be incorporated into the polymer backbone to provide such preferred dihedral angles (i.e. less than or greater than 180°). More particularly, one or more hetero atoms, particularly N, O or S atoms, may be polymer backbone members (i.e. insertion of hetero atoms into the carbon backbone skelton), which will can inhibit neighboring carbon atoms from adopting a substantially trans conformation. The polymer backbone also may comprise alicyclic groups, such as cyclohexyl or cyclopentyl groups, which can inhibit neighboring carbon atoms from adopting a trans conformation. Such groups may be introduced into a polymer backbone by co-polymerization of corresponding monomers such as a vinyl ether, vinyl amine, vinyl sulfide, vinyl sulfinyl or vinyl sulfonyl compound; a divinyl cyclohexyl ether; divinyl cyclopentyl ether; and the like. Backbones of polymers of the invention suitably are at least substantially composed of carbon atoms, more particularly, at least about 60, 70, 80, 90, 95 or 98 mole percent of backbone atoms are carbon.

The polymer also may be appropriately substituted to provide other than a trans conformation of adjacent carbon atoms of a polymer backbone. For example, one carbon of the polymer backbone may be substituted with a hydrogen bond donor (e.g. hydroxy) and an adjacent carbon can be substituted with a hydrogen bond acceptor (e.g. cyano), which will promote hydrogen bonding of those two groups that will promote a conformation of the substituted carbons that is other than trans. Adjacent carbons also could be substituted with groups that sterically promote a conformation that is other than 180°, e.g. one carbon of the backbone could be substituted with a bulky group, e.g. an alkyl moiety having 3, 4, 5, 6 or more carbons such as t-butyl, sec-pentyl, cyclopentyl, cyclohexyl and the like.

Pendant polymer groups also may contain groups that will disrupt neighboring carbon atoms from adopting a trans conformation. For instance, polymers may contain pendant photoacid-labile groups that can comprise a moiety that contains adjacent saturated carbon atoms that are in an other than trans conformation, i.e. other than 180° as discussed above. More particularly, a polymer may contain pendant alicyclic groups such as pendant cyclohexyl or cyclopentyl groups, where adjacent ring carbons are in other than a trans conformation, and typically are in a substantially gauche conformation.

In yet another approach, a polymer may contain unsaturated groups, either integral to the polymer backbone or as a pendant group, which unsaturated group can position neighboring adjacent saturated carbons in other than substantially trans conformation. For instance, a terminal acetylenic compound can be polymerized to provide a carbon-carbon double bond either integral or pendant to the polymer backbone, which double bond can prevent neighboring adjacent saturated carbons from adopting a trans conformation.

Polymers of the invention preferably will have a significant portion of adjacent saturated carbons in other than a trans conformation. For instance, preferably at least about 5 mole percent of adjacent carbon atoms of a polymer will have dihedral angles of other than 180°, more preferably about 10, 15, 20 or 25 mole percent of adjacent carbon atoms will have dihedral angles other than 180°. Particularly suitably will be polymers where at least about 30, 40, 50, 60, 70, 80, or 90 mole percent of adjacent carbon atoms will have dihedral angles other than 180°. Even more preferred is where such polymers have a significant portion of adjacent saturated carbon atoms that are in a substantially gauche conformation, i.e. within about 5°, 10°, 15° or 20° degrees of a dihedral angle of about 60° or about 300°. More particularly, preferred are polymers where at least about 5, 10, 15, 20, 25, 30, 35, 40, 45, 50, 60, 70 or 80 mole percent of adjacent carbon atoms of the polymer have such a substantially gauche conformation.

For a polymer having a carbon-containing backbone, preferably at least about 5 mole percent of adjacent carbon atoms of the backbone will have dihedral angles of other than 180°, more preferably about 10, 15, 20 or 25 mole percent of adjacent carbon atoms will have dihedral angles other than 180°. Particularly suitably will be polymers where at least about 30, 40, 50, 60, 70, 80, or 90 mole percent of adjacent carbon atoms of the backbone have dihedral angles other than 180°. Even more preferred is where such polymers have a significant portion of adjacent saturated carbon atoms that are in a substantially gauche conformation, i.e. within about 5°, 10°, 15° or 20° degrees of a dihedral angle of about 60° or about 300°. More particularly, preferred are polymers where at least about 5, 10, 15, 20, 25, 30, 35, 40, 45, 50, 60, 70 or 80 mole percent of adjacent carbon atoms of the backbone have such a substantially gauche conformation.

It is also preferred not to have "extended runs" of carbons in trans conformations, e.g. where 10, 15, 20, 30, 40, 50, 80, 100, 150 or 200 or more adjacent carbons are in a trans conformation. Such extended trans conformation can be highly absorbing of short wavelength radiation such as 157 nm.

Polymers of the invention may contain a variety of groups. For example, polymers of the invention suitably may contain polymerized cyclic olefin units such as optionally substituted norbornene units; acrylate groups (which includes 2-alkylacrylate groups such as methacrylate herein) such as methyl methacrylate, ethyl methacrylate, and the like; cyano groups such as provided by polymerization of acrylonitrile or methacrylonitrile.

Polymers of the invention also may contain a variety of aromatic groups, preferably substituted with one or more electron-withdrawing groups to reduce undesired absorbance of the short wavelength radiation such as 157 nm by the aromatic group. More particularly suitable are polymers that contain phenyl repeat units, particularly phenolic repeat units that have one or more electron-withdrawing ring substituents such as halogen particularly fluoro, perhaloalkyl particularly perhalo$C_{1-8}$alkyl such as perfluoro$C_{1-8}$alkyl e.g. trifluoromethyl and the like; cyano; nitro; sulfinyl; sulfonyl; etc. Other suitable aromatic groups for polymer repeat units of the invention include polyaromatichydrocarbons e.g. naphthyl, anthracenyl, and the like, preferably substituted at one or more ring positions by electron-withdrawing groups such as those mentioned directly above with respect to phenyl units.

Photoresists of the invention in general comprise a polymer of the invention as discussed above and a photoactive component. Generally preferred resists of the invention are deblocking positive systems, often referred to as chemically amplified resists where a photogenerated acid induces a chemical reaction of one or more components of the resist. Typically preferred is where the resin contains photoacid-labile groups, e.g. a photoacid-labile ester where acid deblocks the ester to provide a polar carboxy group in exposed regions of the resist coating layer. Preferably, such ester groups have adjacent carbon atoms that are in a conformation other than trans, preferably a substantially gauche conformation. For example, a resin may contain polymerized units of cyclohexylacrylate, cyclohexylmethacrylate, cyclopentylacrylate, cyclopentylmethacrylate, tert-butylacrylate, tert-butylmethacrylate, and the like. Those ester groups can undergo a deblocking in the presence of photogenerated acid. For many systems, polymerizered alkyl acrylate (which includes methacrylates and other substituted acrylates) are preferred photoacid-labile moieties of a positive resist. Other suitable acid-labile moieties will include polymerized acetal or ketal moieties, acid-labile moieites that are substituents of phenyl groups, such as photoacid-labile esters (particularly alkyl ester such as cyclohexylesters or cyclopentyl esters), acetals and ketals that are grafted onto phenolic hydroxy moieties.

In addition to positive resists, negative-acting photoresists are also provided that comprise a resin as disclosed above.

The invention also includes methods for forming relief images, including methods for forming a highly resolved relief image such as a pattern of lines where each line has essentially vertical sidewalls and a line width of about 0.40 microns or less, or even about 0.25, 0.20, 01.5 or 0.10 microns or less. The invention further comprises articles of manufacture comprising substrates such as a microelectronic wafer having coated thereon the photoresists and relief images of the invention. Other aspects of the invention are disclosed infra.

DETAILED DESCRIPTION OF THE INVENTION

As discussed above, the invention provides new polymers that can exhibit reduced absorbance (i.e. greater transparency) of high energy radiation, such as radiation having a wavelength of less than 170 or 160 nm, particularly 157 nm.

Polymers of the invention may be homopolymers, or more typically are copolymers that contains two or more distinct repeat units, generally two, three, four or five distinct repeat units. Polymers that have two or three distinct repeat units are particularly preferred. At least one of the repeat units should contain a moiety as discussed above that can inhibit adjacent saturated carbons from adopting a substantially trans conformation.

Polymers of the invention may be substantially free of aromatic groups. More particularly, preferred polymers that are substantially free of aromatic groups contain less than about 5 mole percent aromatic groups, more preferably less than about 1 or 2 mole percent aromatic groups, more preferably less than about 0.1, 0.08, 0.04 and 0.02 mole percent aromatic groups and still more preferably less than about 0.01 mole percent aromatic groups. Particularly preferred polymers are completely free of aromatic groups. Aromatic groups can be highly absorbing of sub-200 nm radiation and thus can be undesirable for polymers used in photoresists imaged with such short wavelength radiation.

Suitable polymers that are substantially or completely free of aromatic groups suitably contain acrylate units such as photoacid-labile acrylate units as may be provided by polymerization of methyladamanatylacrylate, methyladamanylmethacrylate, ethylfencylacrylate, ethylfencylmethacrylate, and the like; fused non-aromatic alicyclic groups such as may be provided by polymerization of a norbornene compound or other alicyclic compound having an endocyclic carbon-carbon double bond; an anhydride such as may be provided by polymerization of maleic anhydride; and the like.

Polymers of the invention may contain aromatic groups. As discussed above, such aromatic groups preferably have one or more ring substituents that are electron-withdrawing groups, e.g. halogen particularly fluoro; or perhaloalkyl, particularly perfluoroalkyl such as trifluoromethyl.

As discussed above, copolymers are preferred resins of the invention. Such copolymers are suitably prepared by polymerization of two or more distinct monomers or oligomers, where at least one of the monomers or oligomers can inhibit adjacent saturated carbon atoms from adopting a substantially trans confoirmation. For example, the following monomers can be co-polymerized: a vinyl phenol preferably substituted with one or more electron withdrawing groups such as fluoro, a styrene preferably substituted with one or more electron withdrawing groups such as fluoro or perfluoroalkyl, and an acrylate with a ester group that is in a non-trans conformation such as cyclohexyl methacrylate ($H_2C=C(CH_3)CO_2C_6H_{11}$).

Polymers of the invention can be prepared by free radical polymerization, e.g., by reaction of a plurality of monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). See Example 1 which follows for exemplary reactions conditions. Suitable reaction temperatures for any particular system can be readily determined empirically by those skilled in the art.

A reaction solvent may be employed if desired. Suitable solvents include alcohols such as propanols and butanols and aromatic solvents such as benzene, chlorobenzene, toluene and xylene. Dimethylsulfoxide and dimethylformamide are also suitable. The polymerization reaction also may be run neat.

A variety of free radical initiators may be employed to prepare the copolymers of the invention. For example, azo compounds may be employed such as azo-bis-2,2'-isobutyronitrile (AIBN) and 1,1'-azobis(cyclohexanecarbonitrile). Peroxides, peresters, peracids and persulfates also can be employed.

Preferably a polymer of the invention will have a weight average molecular weight (Mw) of 1,000 to about 100,000, more preferably about 2,000 to about 30,000 with a molecular weight distribution (Mw/Mn) of about 3 or less, more preferably a molecular weight distribution of about 2 or less. Molecular weights (either Mw or Mn) of the polymers of the invention are suitably determined by gel permeation chromatography.

As discussed above, the polymers of the invention are highly useful as the resin binder component in photoresist compositions, particularly chemically-amplified positive resists. Photoresists of the invention in general comprise a photoactive component and a resin binder component that comprises a polymer as disclosed herein.

The resin binder component preferably is used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Generally, sulfonate compounds are preferred PAGs, particularly sulfonate salts. Two specifically preferred agents are the following PAGS 1 and 2:

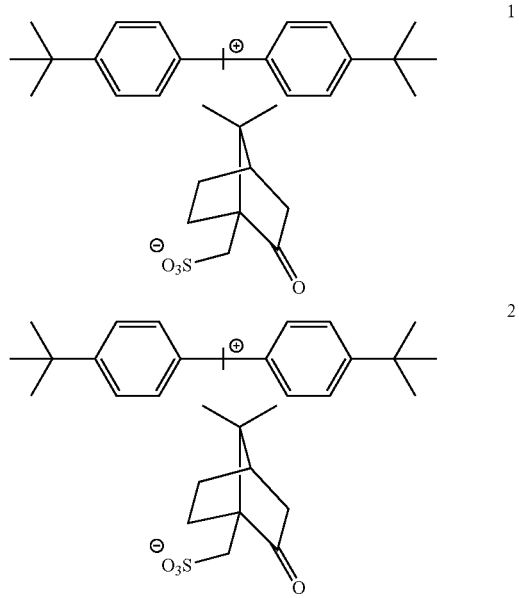

Such sulfonate compounds can be prepared as disclosed in U.S. Pat. No. 5,861,231.

Other suitable sulfonate PAGS including sulfonated esters and sulfonyloxy ketones. See *J. of Photopolymer Science and Technology*, 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al.

Onium salts are also generally preferred acid generators of compositions of the invention. Onium salts that comprise weakly nucleophilic anions have been found to be particularly suitable. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryl-diazonium salts and onium salts of pnictogen, calcogen and halaogen elements, for example, halonium salts, quaternary ammonium, phosphonium and arsoniium salts, aromatic sulfonium salts and sulfoxonium salts or selenium salts. Examples of suitable preferred onium salts can be found in U.S. Pat. Nos. 4,442,197; 4,603,101; and 4,624,912.

Other useful acid generators include the family of nitrobenzyl esters, and the s-triazine derivatives. Suitable s-triazine acid generators are disclosed, for example, in U.S. Pat. No. 4,189,323.

As mentioned above, negative-acting compositions of the invention are also provided. A negative resist of the invention will comprise a mixture of materials that will cure, crosslink or harden upon exposure to acid, and a photoactive component of the invention. Typically negative resists of the invention contain a resin as disclosed herein together with a photoactive compound and a crosslinker component. The crosslinker can be integral to the resin or a separate component.

Particularly preferred negative acting compositions of the invention comprise a separate crosslinker component and a photoactive component of the invention. The photoactive component is suitably a photoacid generator as discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125.

A optional additive of resists of the invention is an added base, such as tetrabutylammonium hydroxide (TBAH), or a salt of TBAH, which can enhance resolution of a developed resist relief image. The added base is suitably used in relatively small amounts, e.g. about 1 to 20 percent by weight relative to the photoactive component (PAG).

Photoresists of the invention also may contain other optional materials. For example, other optional additives include anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 30 percent by weight of the total weight of a resist's dry components.

Photoresists of the invention can be readily prepared. For example, a resist of the invention can be prepared as a coating composition by dissolving the components of the photoresist (e.g., for a positive resist, the resin and a PAG; for a negative resists, a resin, PAG and crosslinker) in a suitable solvent such as, e.g., a glycol ether such as 2-methoxyethyl ether (diglyme), ethylene glycol monomethyl ether, propylene glycol monomethyl ether; lactates such as ethyl lactate or methyl lactate, with ethyl lactate being preferred; proponiates, particularly methyl propionate, ethyl propionate and ethyl ethoxy propionate; or a ketone such as 2-alkanones or cycloalkanones. Cyclohexanone and 2-heptanone are generally preferred. Typically the solid content of the photoresist varies between 5 and 35 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation such as 157 nm or other short wavelength radiation, optionally post-exposure baked to create or enhance solubility differences between exposed and nonexposed regions of the resist coating layer, and then developed preferably with an aqueous alkaline developer to form a relief image. Following development of the photoresist coating over the substrate, the developed substrate may be selectively processed on those areas bared of resist, e.g. by chemically etching or plating substrate areas bared or resist in accordance with known procedures. For the manufacture of microelectronic substrates, e.g. the manufacture of silicon dioxide wafers, suitable etchants include a gas etchant, e.g. a chlorine or fluorine-based etchant such as a $CF_4$ or $CF_4/CHF_3$ etchant applied as a plasma stream.

All documents disclosed herein are incorporated herein by reference. The following non-limiting examples are illustrative of the invention.

EXAMPLE 1

Polymer Synthesis

A polymer of the invention may be suitably prepared as follows. Vinylphenol (1 molar equivalent) cyclohexyl methacrylate (0.5 molar equivalent), and 2,6-difluorostyrene (0.5 molar equivalent) are dissolved in isopropyl alcohol or other solvent. Reaction initiator (azo-bis-2,2'-isobutyronitrile (AIBN)) is added and the reaction is heated until the polymerization is at least substantially complete. Suitably the reaction is heated overnight. The resulting polymer then can be filtered, washed with water and dried.

EXAMPLE 2

Photoresist Preparation and Lithographic Processing

A photoresist of the invention is prepared by mixing the following components with amounts expressed as weight percent based on total weight of the resist compositions:

| Resist components | Amount (wt. %) |
| --- | --- |
| Resin binder | 15 |
| Photoacid generator | 3 |
| Cyclohexanone | 81 |

The resin binder is the terpolymer of Example 1 above. The photoacid generator is di-t-butylphenyl iodonium camphor sulfonate. Those resin and PAG components are admixed in cyclohexanone solvent.

The formulated resist composition is spin coated onto HMDS vapor primed 4 inch silicon wafers and softbaked via a vacuum hotplate at 90° C. for 60 seconds. The resist coating layer is exposed through a photomask at 157 nm, and then the exposed coating layers are post-exposure baked at 110° C. The coated wafers are then treated with aqueous alkaline solution to develop the imaged resist layer.

The foregoing description of the invention is merely illustrative thereof, and it is understood that variations and modifications can be effected without departing from the spirit or scope of the invention as set forth in the following claims.

What is claimed is:

1. A photoresist composition comprising:
   a photoactive component and a resin, wherein at least about 5 mole percent of the adjacent carbons of the resin backbone have a dihedral angle within about 20° of 60° or 300° and the resin is at least substantially free of aromatic group.

2. The photoresist composition of claim 1 wherein at least about 10 mole percent of adjacent carbons of the resin backbone have a dihedral angle within about 20° of 60° or 300°.

3. The photoresist composition of claim 1 wherein at least about 20 mole percent of adjacent carbons of the resin backbone have a dihedral angle within about 20° of 60° or 300°.

4. The photoresist composition of claim 1 wherein at least about 40 mole percent of adjacent carbons of the resin backbone have a dihedral angle within about 20° of 60° or 300°.

5. The photoresist composition of claim 1 wherein the resin comprises polymerized acrylate groups.

6. The photoresist composition of claim 1 wherein the resin comprises polymerized cyclic olefin groups.

7. The photoresist composition of claim 1 wherein the resin comprises one or more hetero atoms as resin backbone members.

8. The photoresist composition of claim 1 wherein the resin comprises one or more alicyclic groups as resin backbone members.

9. The photoresist composition of claim 1 wherein the resin backbone is at least substantially composed of carbon atoms.

10. The photoresist composition of claim 1 wherein the resin contains less than about 1 mole percent of aromatic groups based on total polymer units.

11. The photoresist composition of claim 1 wherein the resin is completely free of aromatic groups.

12. The photoresist composition of claim 1 wherein the photoresist is a deblocking positive-acting photoresist.

13. The photoresist composition of claim 1 wherein the photoresist is a negative-acting photoresist.

14. A method for forming a photoresist relief image, comprising:
(a) applying a coating layer of a photoresist composition of claim 1 on a substrate;
(b) exposing the photoresist coating layer to patterned activating radiation and developing the exposed photoresist layer to provide a relief image.

15. The method of claim 14 wherein the photoresist coating layer is exposed to radiation having a wavelength of less than about 200 nm.

16. The method of claim 14 wherein the photoresist coating layer is exposed to radiation having a wavelength of less than about 170 nm.

17. The method of claim 14 wherein the photoresist coating layer is exposed to radiation having a wavelength of about 157 nm.

18. An article of manufacture having on at least one surface a coating layer of a photoresist composition of claim 1.

19. The article of claim 18 wherein the article is a microelectronic wafer substrate.

20. A photoresist composition comprising:
a photoactive component and a resin, wherein the resin comprises one or more hetero atoms as resin backbone members and the resin is at least substantially free of aromatic groups,
and at least about 10 mole percent of adjacent carbons of the resin backbone have a dihedral angle within about 20° of 60° or 300°.

21. The photoresist composition of claim 20 wherein the resin comprises one or more N, O or S atoms as resin backbone members.

22. The photoresist composition of claim 20 wherein the resin comprises one or more O or S atoms as resin backbone members.

23. The photoresist composition of claim 20 wherein at least about 20 mole percent of adjacent carbons of the resin backbone have a dihedral angle within about 20° of 60° or 300°.

24. The photoresist composition of claim 20 wherein at least about 40 mole percent of adjacent carbons of the resin backbone have a dihedral angle within about 20° of 60° or 300°.

25. The photoresist composition of claim 20 wherein the resin comprises polymerized acrylate groups.

26. The photoresist composition of claim 20 wherein the resin comprises polymerized cyclic olefin groups.

27. The photoresist composition of claim 20 wherein the resin comprises one or more alicyclic groups as resin backbone members.

28. The photoresist composition of claim 20 wherein the resin contains less than about 1 mole percent of aromatic groups based on total polymer units.

29. The photoresist composition of claim 20 wherein the resin is completely free of aromatic groups.

30. The photoresist composition of claim 20 wherein the photoresist is a deblocking positive-acting photoresist.

31. The photoresist composition of claim 20 wherein the photoresist is a negative-acting photoresist.

32. A method for forming a photoresist relief image, comprising:
(a) applying a coating layer of a photoresist composition of claim 20 on a substrate;
(b) exposing the photoresist coating layer to patterned activating radiation and developing the exposed photoresist layer to provide a relief image.

33. The method of claim 32 wherein the photoresist coating layer is exposed to radiation having a wavelength of less than about 200 nm.

34. The method of claim 32 wherein the photoresist coating layer is exposed to radiation having a wavelength of less than about 170 nm.

35. The method of claim 32 wherein the photoresist coating layer is exposed to radiation having a wavelength of about 157 nm.

36. An article of manufacture having on at least one surface a coating layer of a photoresist composition of claim 20.

37. The article of claim 36 wherein the article is a microelectronic wafer substrate.

* * * * *